(12) United States Patent
Kokushi et al.

(10) Patent No.: US 10,716,251 B2
(45) Date of Patent: Jul. 14, 2020

(54) COMPONENT MOUNTING ROBOT SYSTEM

(71) Applicant: KAWASAKI JUKOGYO KABUSHIKI KAISHA, Kobe-shi, Hyogo (JP)

(72) Inventors: Hiroki Kokushi, Kakogawa (JP); Tatsuhiro Uto, Akashi (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 138 days.

(21) Appl. No.: 15/779,573

(22) PCT Filed: Nov. 18, 2016

(86) PCT No.: PCT/JP2016/004917
§ 371 (c)(1),
(2) Date: May 29, 2018

(87) PCT Pub. No.: WO2017/090243
PCT Pub. Date: Jun. 1, 2017

(65) Prior Publication Data
US 2019/0230831 A1    Jul. 25, 2019

(30) Foreign Application Priority Data

Nov. 27, 2015   (JP) ................................ 2015-232050

(51) Int. Cl.
*H05K 13/04* (2006.01)
*B25J 15/06* (2006.01)
(Continued)

(52) U.S. Cl.
CPC ........ *H05K 13/0413* (2013.01); *B25J 9/1005* (2013.01); *B25J 15/06* (2013.01);
(Continued)

(58) Field of Classification Search
CPC .......... B25J 15/06; B25J 9/042; B25J 9/1005; H05K 13/0408; H05K 13/0409; H05K 13/0413
See application file for complete search history.

(56) References Cited

U.S. PATENT DOCUMENTS

| 4,605,569 A * | 8/1986 | Shimada ................... B08B 1/00 |
| | | 427/256 |
| 5,042,774 A | 8/1991 | Kakinuma |

(Continued)

FOREIGN PATENT DOCUMENTS

| JP | S61-079585 A | 4/1986 |
| JP | H02-39500 A | 2/1990 |

(Continued)

*Primary Examiner* — Minh N Trinh
(74) *Attorney, Agent, or Firm* — Oliff PLC

(57) ABSTRACT

A component mounting robot system includes a component transfer robot which transfers a mounting component including a mounting portion to a base component's mounting position; and a jig which corrects the mounting portion's position of the mounting component transferred by the component transfer robot to mounting position, wherein the jig includes a guide portion which corrects the mounting portion's position of the mounting component to the mounting position, and wherein the component transfer robot includes a holding section which holds the mounting component so that a posture of the mounting component is changeable. In this configuration, it becomes possible to construct the component mounting robot system which can correct position of the mounting portion of the mounting component, by changing the posture of the body of the mounting component and guiding the mounting portion to the mounting position even in a case where the mounting component has a cylindrical shape.

8 Claims, 5 Drawing Sheets

(51) Int. Cl.
*B25J 9/10* (2006.01)
*B25J 9/04* (2006.01)

(52) U.S. Cl.
CPC ..... *H05K 13/0408* (2013.01); *H05K 13/0409* (2018.08); *B25J 9/042* (2013.01)

(56) References Cited

U.S. PATENT DOCUMENTS

| | | | | |
|---|---|---|---|---|
| 5,265,317 | A * | 11/1993 | Angel | B23P 21/00 |
| | | | | 228/212 |
| 8,668,423 | B2 * | 3/2014 | Motonaga | B25J 15/0253 |
| | | | | 29/468 |
| 10,507,584 | B2 * | 12/2019 | Peters | B25J 9/1697 |
| 2009/0055024 | A1 * | 2/2009 | Kay | B25J 9/1697 |
| | | | | 700/259 |
| 2011/0185556 | A1 * | 8/2011 | Hirano | B25J 9/0084 |
| | | | | 29/428 |
| 2019/0230831 | A1 * | 7/2019 | Kokushi | B25J 15/06 |

FOREIGN PATENT DOCUMENTS

| | | |
|---|---|---|
| JP | H02-198782 A | 8/1990 |
| JP | H09-83199 A | 3/1997 |
| JP | 2002-178287 A | 6/2002 |

\* cited by examiner

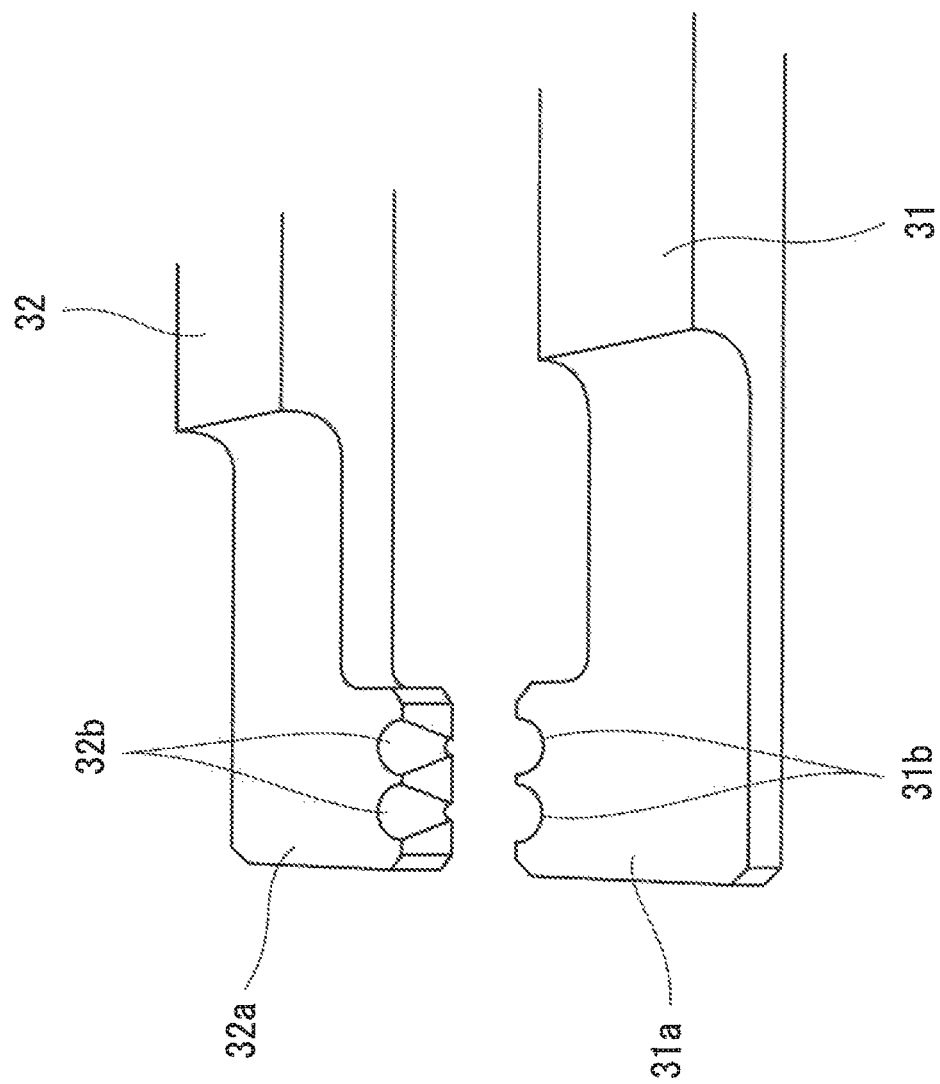

COMPONENT MOUNTING ROBOT SYSTEM

TECHNICAL FIELD

The present invention relates to a component mounting robot system which mounts a mounting component (component to be mounted) on a base component (component on which the mounting component is mountable).

BACKGROUND ART

Conventionally, in a case where a robot mounts a mounting component on a base component, for example, the mounting component is gripped by a chuck or the like and transferred to a mounting position of the base component, and a mounting portion of the mounting component is mounted at the mounting position of the base component. However, for example, in a case where the mounting component such as an electrolytic capacitor is mounted on the base component such as a printed board, the position, inclination, or the like of leg portions which are the mounting portion of the electrolytic capacitor, with respect to a body of the electrolytic capacitor, are often varied (non-uniform) among electrolytic capacitors.

As a prior art of such a component mounting device, there is a device which mounts the mounting component such as a transistor on the base component such as a circuit board (e.g., see Patent Literature 1). This device includes a handling robot which transfers the mounting component and an insertion jig which guides lead terminals as the mounting portion of the mounting component to the mounting position.

CITATION LIST

Patent Literature

Patent Literature 1: Japanese Laid-Open Patent Application Publication No. Hei. 9-83199

SUMMARY OF INVENTION

Technical Problem

However, in the above-described prior art, the handling robot grips the mounting component while keeping the posture of the mounting component and correctly transfers the mounting component to the mounting position, and the jig guides only the lead terminals of the mounting component to the mounting position.

In the above-described prior art, even in a case where the handling robot transfers the mounting component to a correct position, there is a possibility that the lead terminals cannot be guided to the mounting position due to a deviation of position, inclination, and the like which occurs because of the difference among mounting components. In a case where the body of the mounting component such as the electrolytic capacitor has a cylindrical shape, there is a deviation of the position of the leg portions (lead terminals) around a center axis (in a rotational direction) depending on a gripping position of the body. In this case, also, there is a possibility that the leg portions cannot be guided to the mounting position.

Solution to Problem

In view of the above-described circumstances, an object of the present invention is to provide a component mounting robot system which can correct a position of a mounting portion of a mounting component, by changing the posture of a body of the mounting component and guiding the mounting portion to a mounting position, in a state in which the body is held by a component transfer robot, even in a case where the mounting component has a cylindrical shape.

To achieve this object, the present invention provides a component mounting robot system comprising: a component transfer robot which transfers a mounting component which is a component to be mounted and includes a mounting portion to a mounting position of a base component on which the mounting component is mountable; and a jig which corrects a position of the mounting portion of the mounting component transferred by the component transfer robot to the mounting position, wherein the jig includes a guide portion which corrects the position of the mounting portion of the mounting component to the mounting position, and wherein the component transfer robot includes a holding section which holds the mounting component so that a posture of the mounting component is changeable. In the description and claims, the phrase "holds the mounting component so that a posture of the mounting component is changeable" means that the posture of the mounting component held by the component transfer robot is changeable in a state in which the mounting component is held. For example, the mounting component may be held by utilizing a rubber material, or by utilizing a spring.

In accordance with this configuration, the mounting component can be transferred to the mounting position and the position of the mounting portion of the mounting component can be corrected to the mounting position by the guide portion of the jig. During this correction, the mounting component is held by the holding section whose posture is changeable. Therefore, the posture of the mounting component is changed according to the correction of the position of the mounting portion. For example, the posture of the mounting component is changed in such a way that the mounting component is inclined and rotated around a center axis. This makes it possible to correct the position of the mounting portion by guiding the mounting portion to the mounting position while absorbing a position deviation or the like of the mounting portion which occurs due to the difference among mounting components, in a case where the mounting component is transferred to the mounting position.

The holding section may include a holding member which holds an upper portion or side surface of the mounting component. In accordance with this configuration, the upper portion or side surface of the mounting component can be held by the holding member and the posture of the lower portion of the mounting component can be changed. Therefore, by correcting the position of the mounting portion of the mounting component by the guide portion, and changing the posture of the lower portion of the body of the mounting component in such a way that the lower portion of the body is inclined and rotated, the position of the mounting portion can be accurately corrected to the mounting position.

The holding member may include a suction pad which suctions the upper portion or side surface of the mounting component. In accordance with this configuration, since the suction pad holding the mounting component is deformed according to the correction of the position of the mounting portion, and the posture of the lower portion of the body of the mounting component is changed in such a way that the lower portion of the body is inclined and rotated, the position of the mounting portion can be corrected to the mounting position.

The guide portion may have a tapered shape in which a portion of the guide portion on a side from which the mounting portion is inserted has a larger diameter and a portion of the guide portion which is closer to the mounting position has a smaller diameter. In accordance with this configuration, the position of the mounting portion of the mounting component can be corrected to the mounting position along the guide portion with the tapered shape.

The component mounting robot system may further comprise a jig transfer robot which transfers the jig, and the jig transfer robot may include a control section which is configured to be programmable so that the guide portion of the jig is located at the mounting position set in a desired position of the base component. In accordance with this configuration, the position to which the jig is transferred can be programmed depending on the base component. This makes it easier to handle various base components.

The component transfer robot and the jig transfer robot may include arm base portions, respectively, which are placed coaxially (the component transfer robot has an arm base portion, the jig transfer robot has an arm base portion, and these arm base portions are coaxial). In accordance with this configuration, since the arm base portions of the two robots are placed coaxially, the configuration of portions of the component mounting robot system which are placed can be made compact.

Advantageous Effects of Invention

In accordance with the present invention, the position of the mounting portion of the mounting component can be corrected by changing the posture of the body of the mounting component by the guide portion of the jig and guiding the mounting portion to the mounting position in a state in which the body of the mounting component is held by the component transfer robot. Therefore, it becomes possible to properly correct the position of the mounting portion to the mounting position while absorbing a deviation or the like of the mounting portion which occurs due to difference among mounting components, even in a case where the mounting component has, for example, a cylindrical shape.

BRIEF DESCRIPTION OF DRAWINGS

FIG. 4 is a perspective view showing the tip end portion of the jig of FIG. 3.

DESCRIPTION OF EMBODIMENTS

Hereinafter, the embodiment of the present invention will be described with reference to the drawings. In the embodiment described below, description is given by showing the major constituents of a component mounting robot system 1. In the embodiment, it is assumed that a mounting component (component to be mounted) is an electrolytic capacitor C, and a base component (component on which the mounting component is mountable) is a printed board B. In the description and claims, forward and rearward directions and rightward and leftward directions conform to forward and rearward directions and rightward and leftward directions in a state in which a person faces the component mounting robot system 1 shown in FIG. 1.

(Configuration of Component Mounting Robot System 1)

Figure 1:
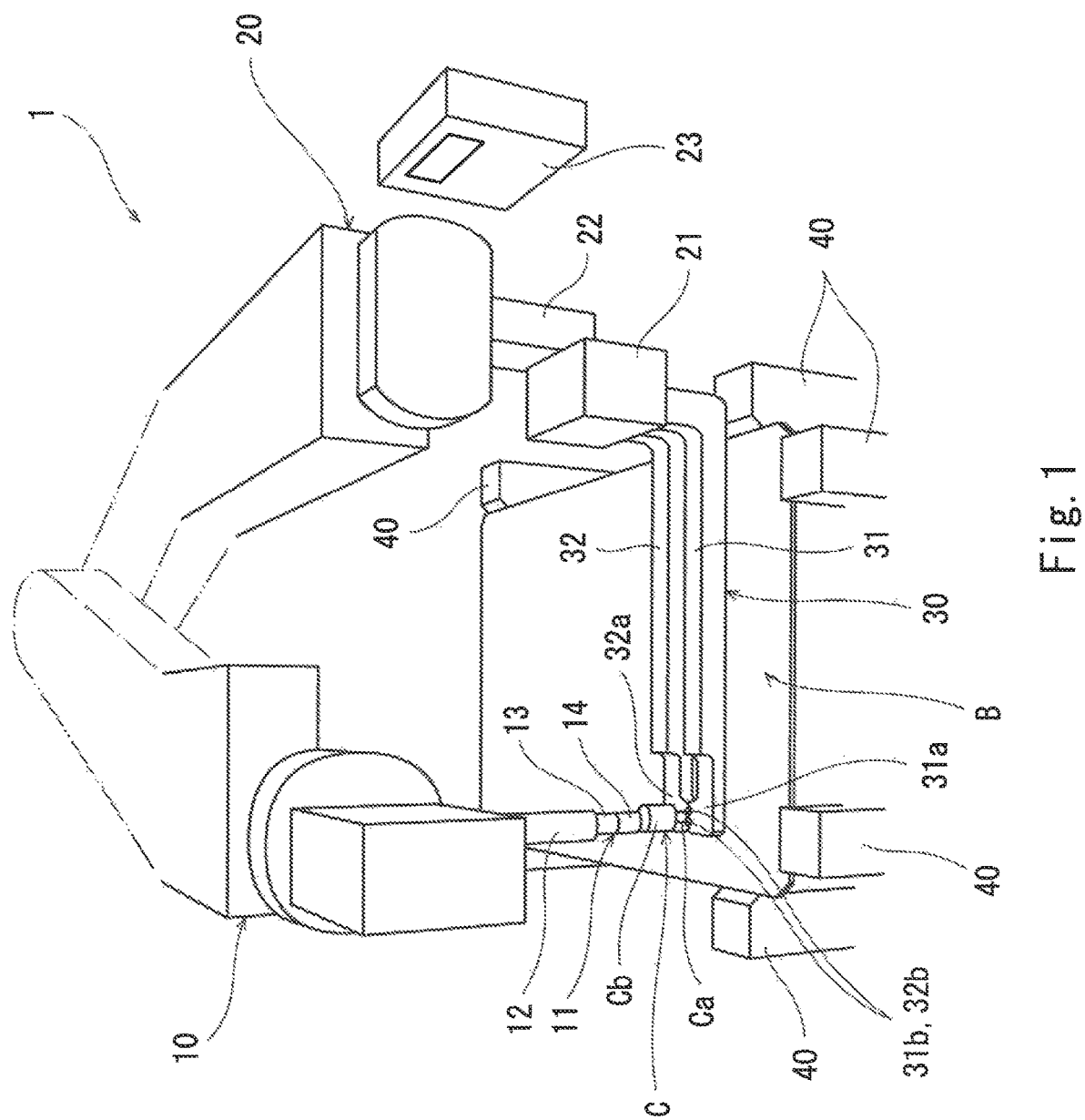
FIG. 1 is a perspective view showing major constituents of a component mounting robot system according to an embodiment of the present invention.

As shown in FIG. 1, the component mounting robot system 1 includes a component transfer robot 10 which transfers an electrolytic capacitor (mounting component) C to mounting positions Ba (holes: FIG. 5) of a printed board (base component) B, and a jig 30 which corrects the positions of leg portions Ca (mounting portion) of the electrolytic capacitor C transferred by the component transfer robot 10 to the mounting positions Ba of the printed board B. A jig transfer robot 20 is configured to transfer the jig 30 to the mounting positions Ba. The jig transfer robot 20 is configured to place the jig 30 so that guide portions 31b, 32b provided at tip end portions 31a, 32a of the jig 30 are correctly disposed at the mounting positions Ba of the printed board B. The printed board B is held at a fixed position by a fixed position holding device 40.

The component transfer robot 10 and the jig transfer robot 20 may be independent robots arranged. In the present embodiment, the component transfer robot 10 and the jig transfer robot 20 have arm base portions coaxially placed (indicated by two-dot chain lines in FIG. 1). In this configuration, since the arm base portions of the two robots are coaxially placed, the configuration of the base portion of the component mounting robot system 1 can be made compact.

(Configuration of Component Transfer Robot 10)

Figure 2:
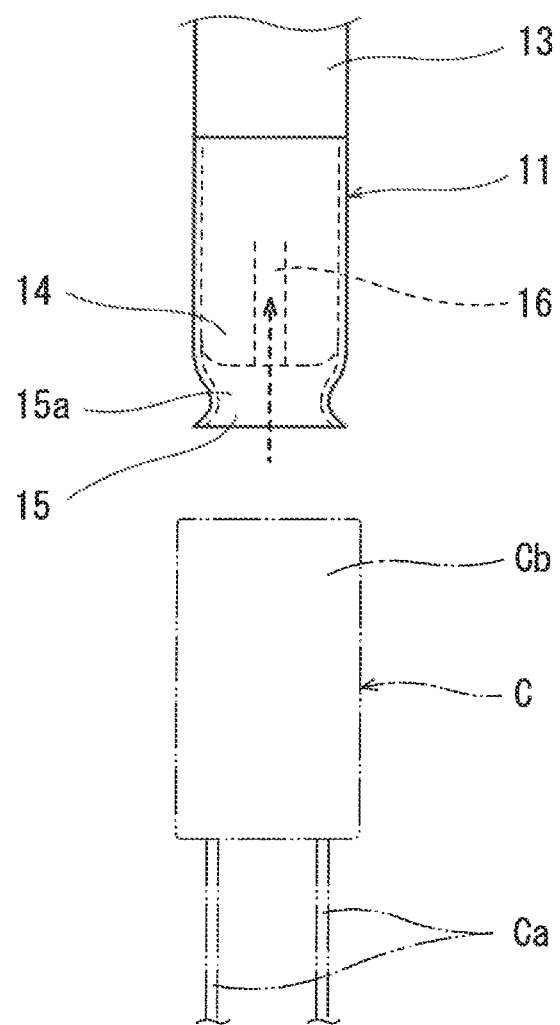
FIG. 2 is a side view showing the tip end portion of a component transfer robot of the component mounting robot system of FIG. 1.

As shown in FIGS. 1 and 2, the component transfer robot 10 includes a holding section 11 for holding the upper portion of a body Cb of the electrolytic capacitor (mounting component) C. The holding section 11 may be configured to hold the upper portion or side surface of the body Cb. The holding section 11 is configured to hold the electrolytic capacitor (mounting component) C so that the posture of the electrolytic capacitor C can be changed (e.g., the electrolytic capacitor C can be inclined and rotated) in a state in which the electrolytic capacitor C is held by the holding section 11. The holding section 11 is provided at a hand 12 of the component transfer robot 10 and extends in a downward direction. The holding section 11 of the present embodiment is provided with a suction pad 14 as a holding member, extending in the downward direction. The suction pad 14 is made of a rubber material. The upper portion of the suction pad 14 is attached on a tubular member 13 extending in the downward direction from the hand 12. The lower portion of the suction pad 14 is formed as a suction surface 15 expanding toward a lower end. The upper portion of the suction surface 15 of the suction pad 14 is provided with a reduced-diameter portion 15a. The posture of the suction surface 15 can be changed in such a way that the suction surface 15 including the reduced-diameter portion 15a is inclined and rotated with respect to the center axis of the suction pad 14. Air is suctioned (indicated by an arrow) through a suction hole 16 extending in the axial direction (upward and downward in FIG. 2) of the tubular member 13 of a mounting portion, and thus the suction surface 15 of the suction pad 14 is able to suction and hold the upper surface of the body Cb of the electrolytic capacitor C. The suction pad 14 is also able to suction and hold the electrolytic capacitor C with a different outer shape.

Therefore, the suction pad 14 is able to change the posture of the electrolytic capacitor C held by the suction surface 15 (incline and rotate the electrolytic capacitor C) according to the correction of the positions of the leg portions Ca of the electrolytic capacitor C. The rubber material of the suction pad 14 is deformed to allow for a change in the posture of the electrolytic capacitor C. This makes it possible to properly change the posture of the body Cb of the electrolytic capacitor C according to the correction of the positions of the leg portions Ca. Since the positions of the leg portions Ca are corrected by changing the posture of the body Cb of the electrolytic capacitor C, it becomes possible to correct the positions of the leg portions Ca while absorbing the deviation of the position or inclination of the leg portions Ca with respect the body Cb, which occurs due to the difference among the electrolytic capacitors C, in a case where the electrolytic capacitor C is placed at the mounting positions Ba.

Holding the electrolytic capacitor (mounting component) C which allows for a change in the posture of the body Cb is not limited to suction. For example, a spring may be provided between the hand 12 of the component transfer robot 10 and a clamper holding the electrolytic capacitor C. By changing the posture of the spring, the clamper holding the body Cb of the electrolytic capacitor C allows the posture of the body Cb of the electrolytic capacitor C to be changed. In this configuration, the posture of the body Cb of the electrolytic capacitor C can be changed and the positions of the leg portions Ca can be corrected.

The holding member (suction pad 14) may have any configuration so long as the holding member is able to hold the electrolytic capacitor (mounting component) C so that the posture of the body Cb of the electrolytic capacitor C can be changed. Holding the electrolytic capacitor C by the holding member is not limited to holding the electrolytic capacitor C by utilizing the rubber material or holding the electrolytic capacitor C by utilizing the spring.

(Configuration of Jig Transfer Robot 20)

Figure 3:
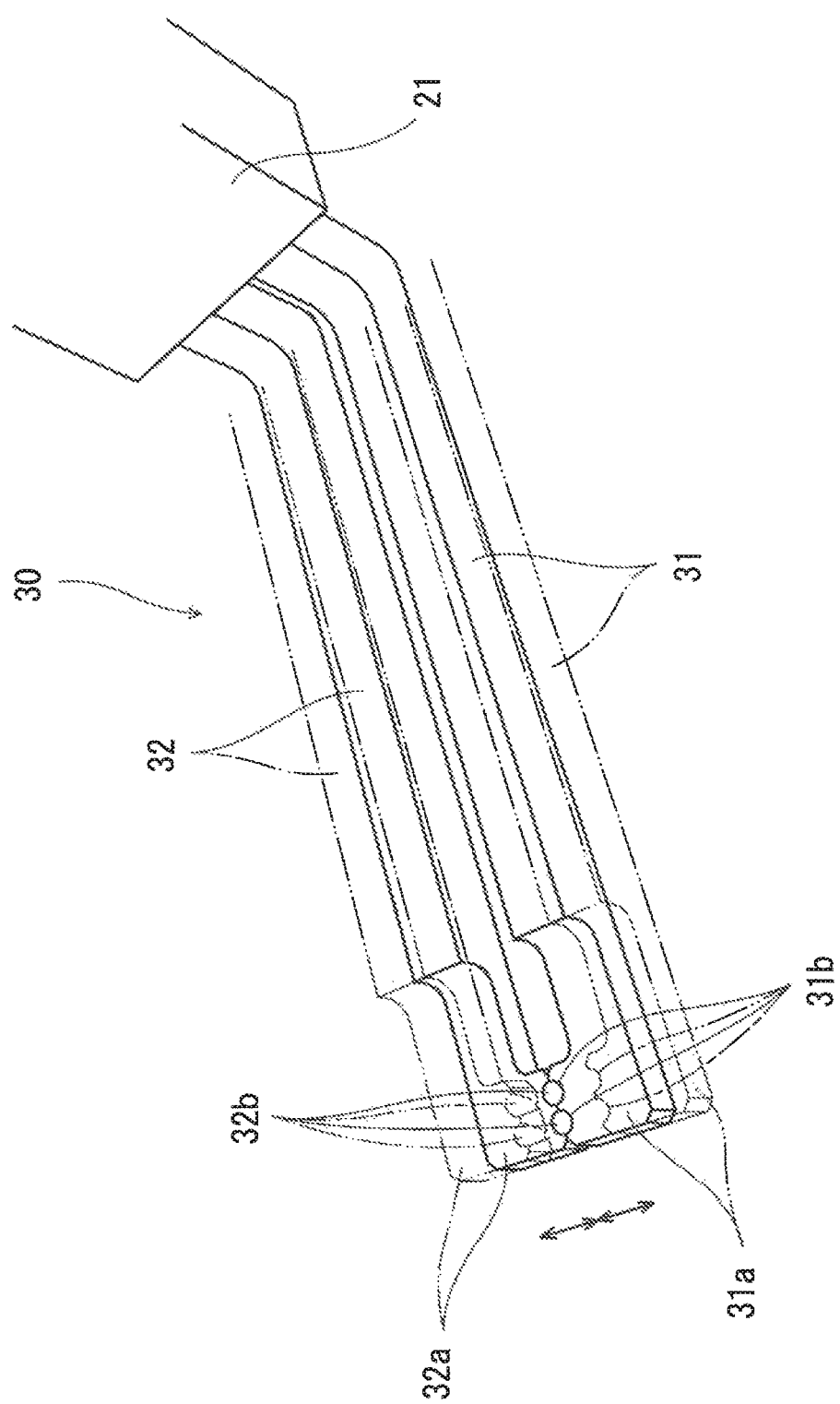
FIG. 3 is a perspective view showing a jig of a jig transfer robot of the component mounting robot system of FIG. 1.

As shown in FIGS. 1 and 3, the jig transfer robot 20 is provided with the jig 30 which guides the leg portions Ca of the electrolytic capacitor C to the mounting positions Ba (holes: FIG. 5) of the printed board B. The jig 30 is mounted on a driving section 21 provided at the hand 22. The jig 30 includes two rod members 31, 32 extending in the forward and rearward directions of FIGS. 1 and 3, from the driving section 21 toward the mounting positions Ba. A driving mechanism (not shown) provided inside the driving section 21 allows the rod members 31, 32 to be opened and closed in the forward and rearward directions of FIGS. 1 and 3 (two-dot chain lines). The driving mechanism is controlled by a control section 23.

The rod members 31, 32 of the jig 30 include guide portions 31b, 32b at their tip end portions 31a, 32a, respectively, to correct the positions of the leg portions Ca of the electrolytic capacitor C to the mounting positions Ba. The tip end portions 31a, 32a are configured so that portions provided with the guide portions 31b, 32b are in contact with each other in a state in which the rod members 31, 32 are closed. In the present embodiment, the electrolytic capacitor C is the mounting component. Therefore, the tip end portion 31a has two guide portions 31b and the tip end portion 32a has two guide portions 32b to be able to guide the two leg portions Ca of the electrolytic capacitor C.

The rod members 31, 32 of the jig 30 are closed when the leg portions Ca of the electrolytic capacitor C are guided and their positions are corrected. After the rod members 31, 32 have corrected the positions of the leg portions Ca to the mounting positions Ba, the rod members 31, 32 are opened in the forward and rearward directions of FIGS. 1 and 3 and moved away from the electrolytic capacitor C (two-dot chain lines).

As shown in FIG. 4, the inner surfaces of the guide portions 31b, 32b of the present embodiment are conical tapered surfaces with a shape in which the upper surface of each of the tip end portions 31a, 32a on a side from Which the leg portion Ca of the electrolytic capacitor C is inserted has a larger diameter, the diameter is reduced toward a lower surface, and the lower surface has a smaller diameter. The diameters of the lower ends of the guide portions 31b, 32b are set so that the leg portions Ca can be guided to the mounting positions Ba, respectively. In a state in which the rod members 31, 32 are closed, the inner surfaces of the guide portions 31b, 32b have a conical shape. Other configurations may be used to allow the guide portions 31b, 32b to correct the positions of the leg portions Ca of the electrolytic capacitor C to the mounting positions Ba.

In accordance with the above-described jig 30, the positions of the leg portions Ca of the electrolytic capacitor C can be corrected to the mounting positions Ba along the guide portions 31b, 32b with the tapered shape.

In the jig transfer robot 20, the control section 23 is configured to be programmable so as to locate the guide portions 31b, 32b of the jig 30 at desired mounting positions Ba of the printed board B so that the electrolytic capacitor C can be mounted on the desired mounting positions Ba set in the printed board B. In other words, the control section 23 is able to program the position to which the jig 30 is transferred, depending on the printed board B. Therefore, various printed board B can be handled.

(Operation of Component Mounting Robot System 1)

Next, the operation for correcting the electrolytic capacitor (mounting component) C which is performed by the component mounting robot system 1, will be described with reference to FIG. 5A which is a side view showing a state in which the mounting component held by the component transfer robot is transferred to the position of the jig, and FIG. 5B which is a side view showing a state in which the position of the mounting portion of the mounting component is corrected by the jig and the mounting portion is inserted into the base component.

Figure 5A:
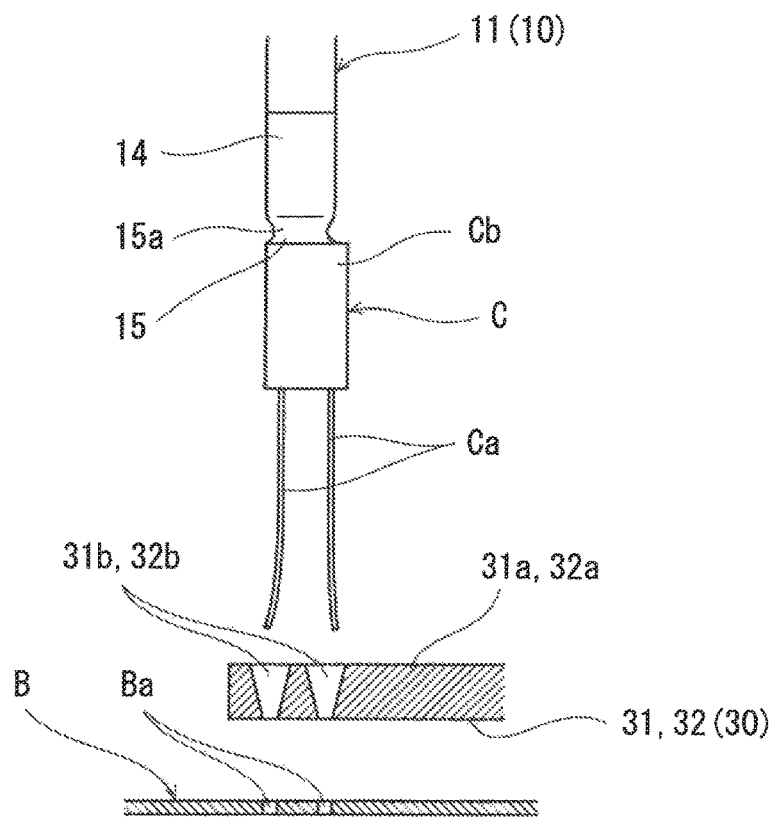
FIG. 5A is a side view showing the movement of a mounting component moved by the component mounting robot system of FIG. 1, and showing a state in which the mounting component held by the component transfer robot is transferred to a position of the jig.

With reference to FIG. 5A, an example of mounting the electrolytic capacitor C at the mounting positions Ba of the printed board B by the component mounting robot system 1 will be described. The jig transfer robot 20 transfers the jig 30 so that the guide portions 31b, 32b provided at tip end portions 31a, 32a of the rod members 21, 32 are located at positions that are above the mounting positions Ba. In the case of the electrolytic capacitor Ca as the mounting component, in most cases, the two leg portions Ca are relatively long, and are not parallel to the center axis of the body Cb. The electrolytic capacitor C is transferred to the mounting positions Ba of the printed board B in a state in which the upper portion of the body Cb is suctioned by the suction pad 14 of the component transfer robot 10.

Figure 5B:
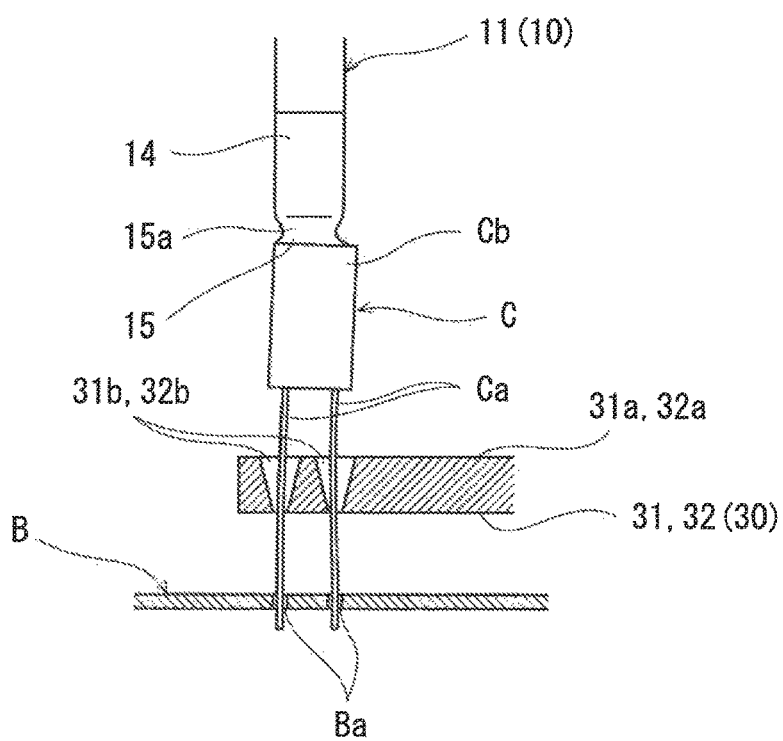
FIG. 5B is a side view showing the movement of the mounting component moved by the component mounting robot system of FIG. 1, and showing a state in which the position of a mounting portion of the mounting component is corrected by the jig and the mounting portion is inserted into a base component.

As shown in FIG. 5B, the electrolytic capacitor C transferred to the mounting positions Ba by the component transfer robot 10 is moved in the downward direction toward the jig 30, by the component transfer robot 10. The leg portions Ca of the electrolytic capacitor C which are inserted into the guide portions 31b, 32b of the jig 30 are moved in the downward direction while the positions of the leg portions Ca are corrected along the tapered surfaces of the guide portions 31b, 32b.

At this time, the body Cb of the electrolytic capacitor C is held by the suction pad 14 which is deformable. Therefore, the suction surface 15 and the reduced-diameter portion 15a at the upper portion of the suction surface 15, of the suction pad 14, are deformed, as the leg portions Ca are guided along the guide portions 31b, 32b. By this deformation of the suction pad 14, the posture of the body Cb of the electrolytic capacitor C is changed in such a way that the body Cb is inclined and rotated. Since the posture of the body Cb of the electrolytic capacitor C is changed, position deviation or the like of the leg portions Ca, which occurs due to the difference among the electrolytic capacitors C, is absorbed, and thus, the leg portions Ca can be correctly guided toward the mounting positions Ba along the guide portions 31b, 32b of the jig 30. The leg portions Ca, whose positions have been corrected by the guide portions 31b, 32b of the jig 30, protrude from the lower surface of the jig 30 and are inserted into the mounting positions Ba, respectively.

As described above, the above-described component mounting robot system 1 is configured to transfer the electrolytic capacitor C in a state in which the suction pad 14 holds the upper portion of the body Cb of the electrolytic capacitor C. In this configuration, when the leg portions Ca provided at the lower portion of the electrolytic capacitor C are inserted into the guide portions 31b, 32b of the jig 30, the suction pad 14 is deformed and the posture of the body Cb is changed. Therefore, even in a case where there is a deviation of the position or inclination of the leg portions Ca with respect to the body Cb, which occurs due to the difference among the electrolytic capacitors C, such a deviation can be absorbed. As the leg portions Ca are guided to the mounting positions Ba and their positions are corrected, the posture of the body Cb is also changed in such a way that the body Cb is inclined and rotated. Therefore, in a case where the electrolytic capacitor C is transferred to the mounting positions Ba, the positions of the leg portions Ca can be corrected while absorbing non-uniformity such as position deviation or placement deviation of the leg portions Ca, which occurs due to the difference among the electrolytic capacitors C. As a result, it becomes possible to perform a work operation for properly guiding the leg portions Ca of the electrolytic capacitor C to the mounting positions Ba of the printed board B and inserting the leg portions Ca into the mounting positions Ba.

Therefore, the electrolytic capacitor C can be transferred to the mounting positions Ba and the jig 30 can correct the positions of the leg portions Ca of the electrolytic capacitor C to the mounting positions Ba.

As described above, in accordance with the above-described component mounting robot system 1, in a case where the mounting component (electrolytic capacitor C) including the mounting portion (leg portions Ca) is transferred to the mounting positions Ba of the base component (printed board B) and mounted on the base component, the guide portions 31b, 32b of the jig 30 are correctly placed at the mounting positions Ba. In this state, the posture of the body Cb of the mounting component (electrolytic capacitor C) is changed, and the mounting portion (leg portions Ca) can be correctly guided to the mounting positions Ba along the guide portions 31b, 32b of the jig 30. In this way, it becomes possible to absorb a deviation due to the difference among the mounting portions (leg portions Ca), a placement position error, or the like.

Therefore, in accordance with the above-described component mounting robot system 1, even in a case where the configuration of the mounting component is non-uniform, or a case where it is difficult to always hold the mounting component at a fixed position, the mounting component can be properly mounted on the base component.

Other Embodiments

Although in the above-described embodiment, the component mounting robot system 1 includes the component transfer robot 10 and the jig transfer robot 20, the jig transfer robot 20 for transferring the jig 30 may be omitted in a case where the mounting positions Ba of the electrolytic capacitor C (mounting component) are fixed. Thus, the configuration of the robot is not limited to the above-described embodiment.

Although in the above-described embodiment, the mounting component is the electrolytic capacitor C, and the base component is the printed board B, the mounting component may be, for example, IC, a pin, or a rod as well as the electrolytic capacitor, and the base component may be, for example, a substrate (board), a casing, or a cylinder on which the pin or the rod is mountable. Thus, a combination of the mounting component and the base component is not limited to a combination of the electrolytic capacitor C and the printed board B.

The above-described embodiment is exemplary. The number of locations where the guide portions 31b, 32b of the jig 30 are provided may be, for example, one or three, depending on the number of mounting portions of the mounting component. The constituents can be changed in various ways without departing from the scope of the invention. The present invention is not limited to the above-described embodiment.

REFERENCE SIGNS LIST 1 component mounting robot system
10 component transfer robot
11 holding section
14 suction pad (holding member)
15 suction surface
15a reduced-diameter portion
16 suction hole
20 jig transfer robot
21 driving section
23 control section
30 jig
31, 32 rod member
31a, 32a tip end portion
31b, 32b guide portion
B printed board (based component)
Ba mounting position
C electrolytic capacitor (mounting component)
Ca leg portion (mounting portion)
Cb body

The invention claimed is:
1. A component mounting robot system comprising:
 a component transfer robot which transfers a mounting component to a mounting position of a base component, the mounting component being a component to be mounted and including a mounting portion; and a jig which corrects a position of the mounting portion of the mounting component transferred by the component transfer robot to the mounting position, wherein the jig includes a guide portion which corrects the position of the mounting portion of the mounting component to the mounting position, wherein the component transfer robot includes a holding section which holds the mounting component so that a posture of the mounting component is changeable, wherein the holding section includes a holding member with a holding surface that holds an upper portion or side surface of the mounting component, wherein the holding member is formed in a tubular shape, and wherein a posture of the holding member is changeable in such a way that an inclination of the holding surface with respect to a center axis of the holding member is changeable due to the mounting portion of the mounting component being guided by the guide portion.

2. The component mounting robot system according to claim 1, wherein the holding member includes a suction pad which suctions the upper portion or side surface of the mounting component.

3. The component mounting robot system according to claim 1, wherein the guide portion has a tapered shape in which a portion of the guide portion on a side from which the mounting portion is inserted has a larger diameter and a portion of the guide portion which is closer to the mounting position has a smaller diameter.

4. The component mounting robot system according to claim 3, wherein the jig includes two arms configured to be opened and closed, each arm having a separate part of the tapered shape, and wherein the guide portion having the tapered shape is formed when the two arms are closed and the separate parts of the tapered shape are brought together.

5. The component mounting robot system according to claim 1, further comprising:

a jig transfer robot which transfer the jig, wherein the jig transfer robot includes a control section which is configured to be programmable so that the guide portion of the jig is located at the mounting position set in a desired position of the base component.

6. The component mounting robot system according to claim 5, wherein the component transfer robot and the jig transfer robot include arm base portions, respectively, which are placed coaxially.

7. The component mounting robot system according to claim 1, wherein a material of the holding member is deformable.

8. The component mounting robot system according to claim 7, wherein the holding member includes a reduced-diameter portion that facilitates deformation of the holding member.

* * * * *